US008912654B2

(12) United States Patent
Kreupl et al.

(10) Patent No.: US 8,912,654 B2
(45) Date of Patent: Dec. 16, 2014

(54) SEMICONDUCTOR CHIP WITH INTEGRATED VIA

(75) Inventors: Franz Kreupl, Munich (DE); Harry Hedler, Germering (DE)

(73) Assignee: Qimonda AG, Munich (DE)

( * ) Notice: Subject to any disclaimer, the term of this patent is extended or adjusted under 35 U.S.C. 154(b) by 763 days.

(21) Appl. No.: 12/101,501

(22) Filed: Apr. 11, 2008

(65) Prior Publication Data
US 2009/0256258 A1 Oct. 15, 2009

(51) Int. Cl.
*H01L 23/48* (2006.01)
*H01L 23/52* (2006.01)
*H01L 21/44* (2006.01)
*H01L 21/683* (2006.01)
*H01L 21/768* (2006.01)
*H01L 25/065* (2006.01)
*H01L 23/00* (2006.01)

(52) U.S. Cl.
CPC ..... *H01L 23/481* (2013.01); *H01L 2224/13147* (2013.01); *H01L 21/6835* (2013.01); *H01L 2225/06541* (2013.01); *H01L 2225/06517* (2013.01); *H01L 21/76898* (2013.01); *H01L 25/0657* (2013.01); *H01L 2224/16* (2013.01); *H01L 2924/19041* (2013.01); *H01L 2224/13144* (2013.01); *H01L 24/11* (2013.01); *H01L 2924/01079* (2013.01); *H01L 24/12* (2013.01); *H01L 2224/13025* (2013.01); *H01L 2224/13124* (2013.01); *H01L 2221/68372* (2013.01); *H01L 2924/14* (2013.01); *H01L 2224/2518* (2013.01)
USPC ............................. 257/741; 257/774; 438/667

(58) Field of Classification Search
CPC .......... H01L 2924/01078; H01L 2924/01079; H01L 2924/01029; H01L 25/0657; H01L 21/76898

USPC .......... 257/700, 712, 747, 777, 741; 438/109, 438/122, 667
See application file for complete search history.

(56) References Cited

U.S. PATENT DOCUMENTS

| 5,614,766 | A | 3/1997 | Takasu et al. | |
|---|---|---|---|---|
| 6,399,203 | B1 * | 6/2002 | Kondo et al. | 428/408 |
| 6,448,661 | B1 | 9/2002 | Kim et al. | |
| 6,566,704 | B2 * | 5/2003 | Choi et al. | 257/314 |
| 6,611,052 | B2 | 8/2003 | Poo et al. | |
| 6,614,104 | B2 | 9/2003 | Farnworth et al. | |
| 7,060,595 | B2 * | 6/2006 | Ou et al. | 438/484 |
| 7,074,689 | B2 * | 7/2006 | Gutsche et al. | 438/386 |
| 7,211,900 | B2 | 5/2007 | Shin et al. | |
| 7,282,804 | B2 | 10/2007 | Lee | |

(Continued)

FOREIGN PATENT DOCUMENTS

WO WO 2005033358 A2 * 4/2005

OTHER PUBLICATIONS

Masaya Kawano, A 3D Packaging Technology for High-Density Stacked DRAM, International Symposium on VLSI Technology, Systems and Applications, 2007. VLSI-TSA 2007. Hsinchu, Taiwan. Proceedings of Technical Papers. Issue Date : Apr. 23-25, 2007.

(Continued)

*Primary Examiner* — Fernando L Toledo
*Assistant Examiner* — Neil Prasad
(74) *Attorney, Agent, or Firm* — Patterson & Sheridan, LLP

(57) ABSTRACT

An integrated circuit with a substrate with a lower and an upper surface is described. A via extends between the upper and the lower surface of the substrate. The via contains a conductive filling material that comprises carbon.

32 Claims, 6 Drawing Sheets

(56) References Cited

U.S. PATENT DOCUMENTS

| | | |
|---|---|---|
| 7,335,994 B2 | 2/2008 | Klein et al. |
| 7,462,925 B2 | 12/2008 | Tsai et al. |
| 7,532,480 B1 * | 5/2009 | Mimberg ................ 361/721 |
| 7,598,617 B2 | 10/2009 | Lee et al. |
| 7,919,844 B2 * | 4/2011 | Ozguz et al. ............ 257/686 |
| 2002/0074637 A1 | 6/2002 | McFarland |
| 2003/0059968 A1 * | 3/2003 | Cheng et al. ............ 438/20 |
| 2004/0214786 A1 * | 10/2004 | Hofmann et al. ......... 514/44 |
| 2005/0145838 A1 * | 7/2005 | Furukawa et al. ........ 257/20 |
| 2006/0043598 A1 * | 3/2006 | Kirby et al. ............ 257/774 |
| 2006/0046463 A1 * | 3/2006 | Watkins et al. .......... 438/622 |
| 2006/0286696 A1 * | 12/2006 | Peiffer et al. ........... 438/27 |
| 2007/0010094 A1 * | 1/2007 | Kreupl et al. ........... 438/674 |
| 2007/0148963 A1 * | 6/2007 | Chan et al. ............. 438/637 |
| 2007/0215992 A1 | 9/2007 | Shen et al. |
| 2008/105984 A1 | 5/2008 | Lee |
| 2008/0164611 A1 * | 7/2008 | Hedler et al. ........... 257/739 |
| 2008/0191335 A1 * | 8/2008 | Yang et al. ............. 257/680 |
| 2008/0241755 A1 * | 10/2008 | Franklin et al. ......... 430/296 |
| 2009/0200652 A1 | 8/2009 | Oh et al. |

OTHER PUBLICATIONS

Office Action History of U.S. Appl. No. 12/028,542, dates ranging from Apr. 13, 2010 to Jan. 27, 2011.

* cited by examiner

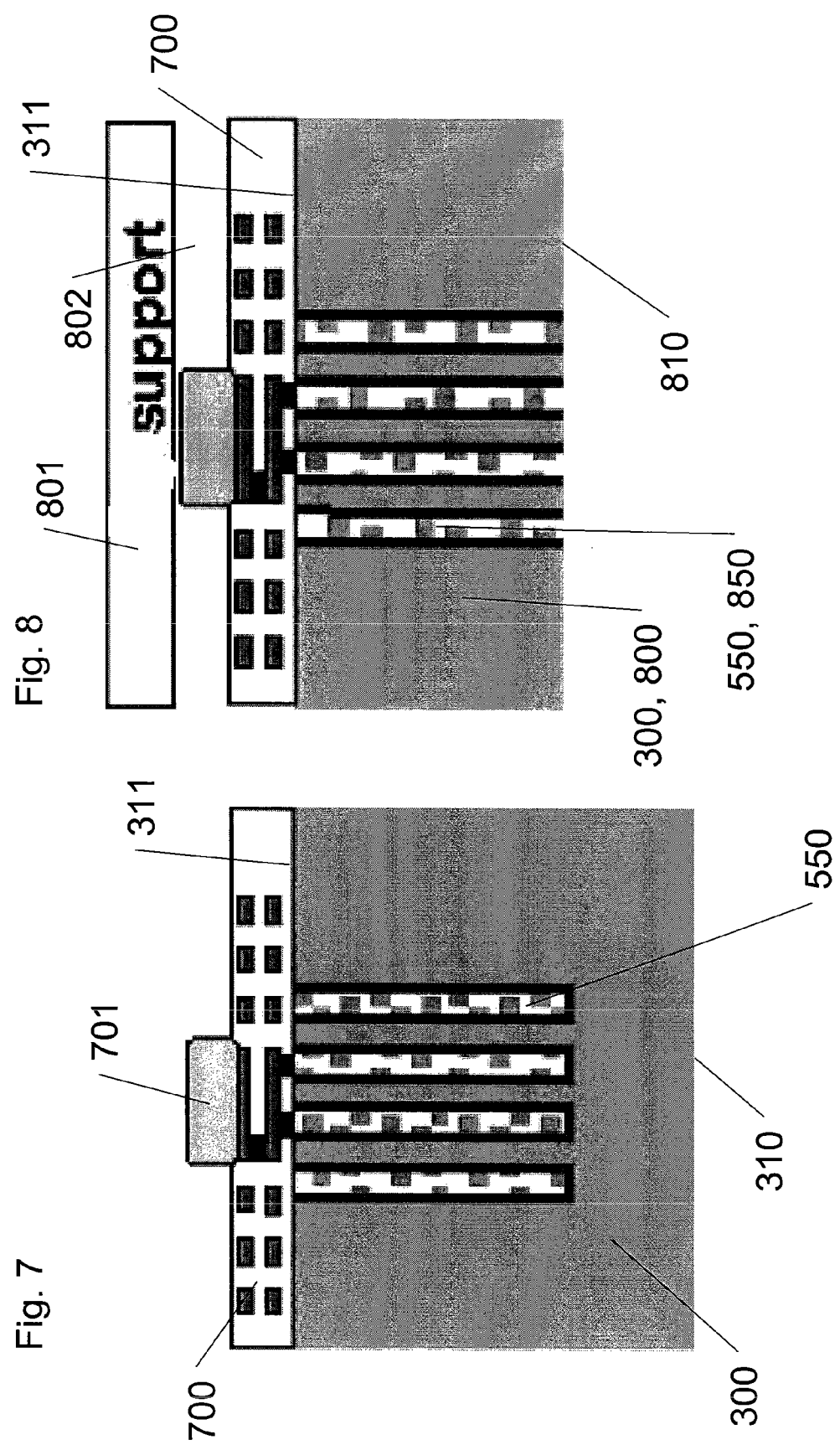

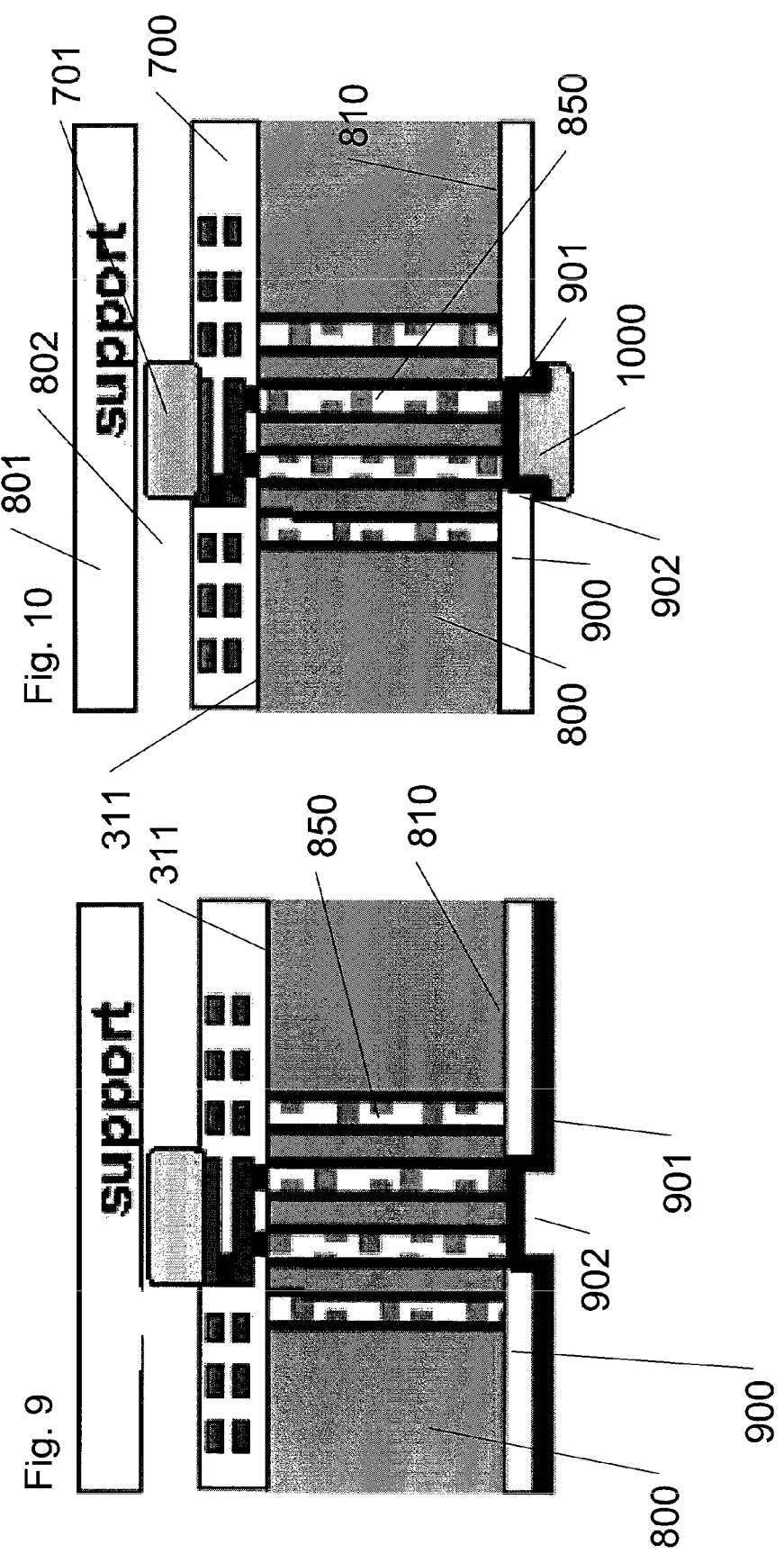

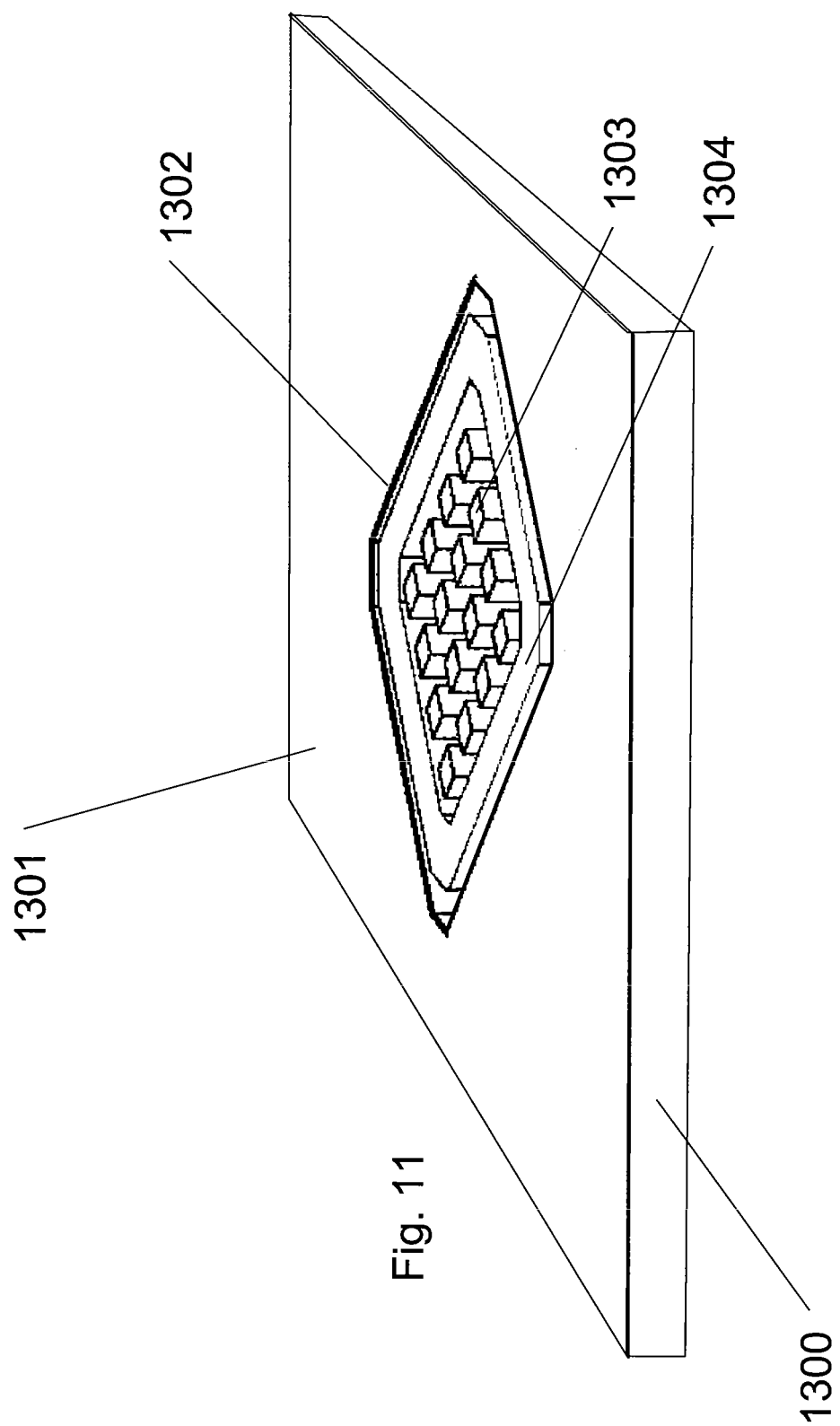

US 8,912,654 B2

SEMICONDUCTOR CHIP WITH INTEGRATED VIA

BACKGROUND OF THE INVENTION

Recently, stacked die packaging with through-silicon-via technology has been intensively studied because of its higher performance, higher operation speed and smaller volume. The major challenge in through-silicon-via stacking is the realization of high aspect ratio vias, which are passivated and filled with conductive material.

In general, through-silicon-vias can be produced using via-first or via-last technologies. In via-last technologies the through-silicon-vias are produced after the transistor process. In via-first technologies the through-silicon-vias are produced before the transistor process. In via-first-technologies the through-silicon-vias are exposed to the full thermal budget of the high temperature transistor process.

The high thermal budget encountered by the through-silicon-vias in a via-first-technology influences the specific resistivity of the through-silicon-vias. Due to the high temperatures during the transistor process, applicability of metals with a low specific resistivity as a conductive filling material inside the through-silicon-vias is limited.

Polycrystalline silicon has been proposed as a conductive filling material for through-silicon-vias in a via-first-technology. The polycrystalline silicon may be deposited inside the through-silicon-vias by chemical vapor deposition. To allow for a high throughput of polycrystalline silicon filling, silicon posts may be left behind inside the vias after the formation of the through-silicon-vias. Since polycrystalline silicon grows from the side walls of the vias, smaller gaps between the silicon posts inside the vias reduce the filling time.

The high thermal budget of the following transistor process, however, leads to a specific resistivity of 2 mΩ cm to 10 mΩ cm. It is, however, regarded as desirable to obtain through-silicon-vias with a filling material with a specific resistivity below 1 mΩ cm.

BRIEF DESCRIPTION OF THE DRAWINGS

So that the manner in which the above-recited features can be understood in detail, a more particular description, briefly summarized above, may be held by reference to embodiments, some of which are illustrated in the appending drawings. It is to be noted, however, that the appended drawings illustrates only typical embodiments and are therefore not to be considered limiting of the scope, for the invention may admit to other equally effective embodiments.

FIG. 7 shows a schematic representation of a substrate with filled holes and a metallization layer according to an embodiment of the present invention;

FIG. 8 shows a schematic representation of a semiconductor chip with vias according to an embodiment of the present invention;

FIG. 9 shows a schematic representation of a semiconductor chip with vias according to an embodiment of the present invention;

FIG. 10 shows a schematic representation of a semiconductor chip with vias according to an embodiment of the present invention;

FIG. 11 shows a schematic representation of a substrate with a hole according to an embodiment of the present invention.

DETAILED DESCRIPTION OF THE PREFERRED EMBODIMENT

The present invention relates to a semiconductor chip with an integrated via, to a chip stack and to a method to produce a semiconductor chip with an integrated via.

One embodiment of the invention provides an integrated circuit with a substrate with a lower and an upper surface. A via extends between the upper and the lower surface and contains a conductive filling material that comprises carbon.

Another embodiment of the invention provides a chip stack containing a plurality of integrated circuits. Each integrated circuit includes a substrate with a lower and an upper surface and a via extending between the upper and the lower surface. Each via contains a filling material that comprises conductive carbon. The integrated circuits are vertically arranged on top of each other. The vias of two neighboring integrated circuits are electrically connected.

Another embodiment of the invention provides a method for producing an integrated circuit with an integrated via. The method includes the steps of providing a semiconductor substrate with an upper and a lower surface, partially removing substrate material to form at least one hole extending perpendicular from the upper surface into the substrate, depositing a conductive filling material containing carbon inside the hole, and partially removing substrate material from the lower surface of the substrate.

Figure 1:
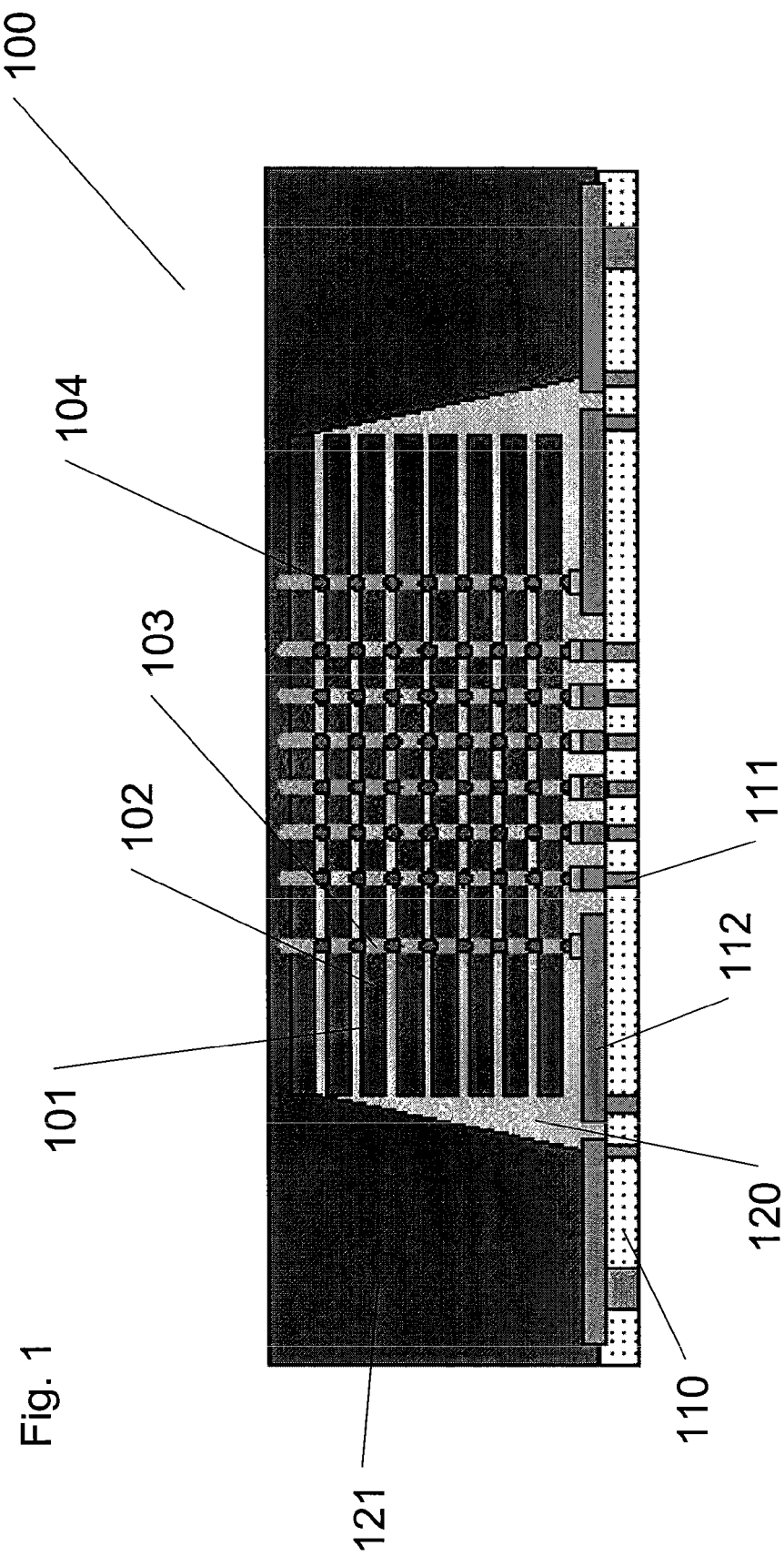
FIG. 1 shows a schematic representation of a chip stack according to an embodiment of the present invention.

FIG. 1 shows a schematic representation of a chip package 100 according to an embodiment of the present invention. The chip package 100 may for example be a memory chip package, like a DRAM, SRAM, or flash memory, or another volatile or non-volatile memory.

The chip package 100 may comprise a chip stack 101. The chip stack 101 may comprise a plurality of semiconductor chips 102. Each semiconductor chip 102 comprises a plurality of vias 103 that extend from one surface of the semiconductor chip 102 to the other surface of the semiconductor chip 102. Such vias 103 may also be referred to as through vias or through silicon vias. Each via 103 may be filled with a conductive material that contains carbon. Each via 103 may provide an electrical connection from one surface of the semiconductor chip 102 to the other surface of the semiconductor chip 102. All semiconductor chips 102 in the chip stack 101 may comprise the same number of vias 103 located at the same positions of the semiconductor chips 102. According to another embodiment of the present invention the semiconductor chips 102 may not all comprise the same number of vias 103.

In the chip stack 101, the plurality of semiconductor chips 102 may be arranged on top of each other. All semiconductor chips 102 of the plurality of semiconductor chips 102 in the chip stack 101 may comprise the same lateral dimensions. According to another embodiment, different semiconductor chips 102 in the chip stack 101 may comprise different lateral dimensions. In the chip stack 101, the semiconductor chips 102 may be arranged on top of each other such that the vias 103 of each semiconductor chip 102 are vertically arranged on top of each other. The vias 103 of the topmost semiconductor chip 102 of the chip stack 101 may be arranged above the vias 103 of the second topmost semiconductor chip 102 of the chip stack 101. The vias 103 of the second topmost semiconductor chip 102 of the chip stack 101 may be arranged above the vias 103 of the third topmost semiconductor chip 102 of the chip stack 101. The vias 103 of the second lowermost semiconductor chip 102 of the chip stack 101 may be arranged above the vias 103 of the lowermost semiconductor chip 102 of the chip stack 101.

The vias 103 of two neighboring semiconductor chips 102 of the chip stack 101 may be electrically connected through bonds 104. The via 103 of the topmost semiconductor chip 102 of the chip stack 101 may be electrically connected to a consecutive via 103 of the second topmost semiconductor chips 102 of the chip stack 101 through a bond 104. The via 103 of the second topmost semiconductor chip 102 of the chip stack 101 may be electrically connected to a consecutive via 103 of the third topmost semiconductor chip 102 of the chip stack 101 through a bond 104. The bonds 104 may for example be gold bumps.

The chip stack 101 may be arranged on a feedthrough interposer chip 110. The feedthrough interposer chip 110 may comprise an upper surface and a lower surface. On the upper surface of the feedthrough interposer chip 110, contact pads 112 may be provided. The contact pads 112 on the upper surface of the feedthrough interposer chip 110 may for example be gold contact pads.

The feedthrough interposer chip 110 may further comprise a plurality of interconnects 111 that provide an electrical connection between the upper surface of the feedthrough interposer chip 110 and the lower surface of the feedthrough interposer chip 110. Each contact pad 112 on the upper surface of the feedthrough interposer chip 110 may be electrically connected to one or more interconnects 111.

In the embodiment shown, the chip stack 101 may be arranged on the upper surface of the feedthrough interposer chip 110. The vias 103 of the lowermost semiconductor chip 102 of the chip stack 101 may be electrically connected to contact pads 112 of the feedthrough interposer chip 110. A via 103 of the lowermost semiconductor chip 102 of the chip stack 101 may be electrically connected to a contact pad 112 of the feedthrough interposer chip 110 through a bond 104.

An interconnect 111 of the feedthrough interposer chip 110 may comprise a conductive connection to one contact pad 112 of the feedthrough interposer chip 110. A contact pad 112 of the feedthrough interposer chip 110 comprises a conductive connection to a via 103 of the lowermost semiconductor chip 102 of the chip stack 101. A via 103 of the lowermost semiconductor chip 102 of the chip stack 101 may comprise a conductive connection to a via 103 of the second lowermost semiconductor chip 102 of the chip stack 101. A via 103 of the second topmost semiconductor chip 102 of the chip stack 101 may comprise a conductive connection to a via 103 of the topmost semiconductor chip 102 of the chip stack 101.

The space in between the plurality of semiconductor chips 102 of the chip stack 101 and the space between the lowermost semiconductor chip 102 of the chip stack 101 and the feedthrough interposer chip 110 may be filled with a resin 120. The resin 120 may isolate the semiconductor chips 102 of the chip stack 101 from each other. The resin 120 may also isolate the chip stack 101 from the feedthrough interposer chip 110. The resin 120 may also hold the plurality of semiconductor chips 102 of the chip stack 101 together.

The chip stack 101 and the feedthrough interposer chip 110 may be molded with a molding material 121. The molding material 121 may mechanically stabilize the chip stack 101 on the feedthrough interposer chip 110. The molding material 121 may also seal the chip stack 101 and the feedthrough interposer chip 110. The molding material 121 may be arranged on the upper surface of the feedthrough interposer chip 110. On the lower surface of the feedthrough interposer chip 110, the interconnects 111 may provide conductive connections to the semiconductor chips 102 of the chip stack 101.

Figure 2:
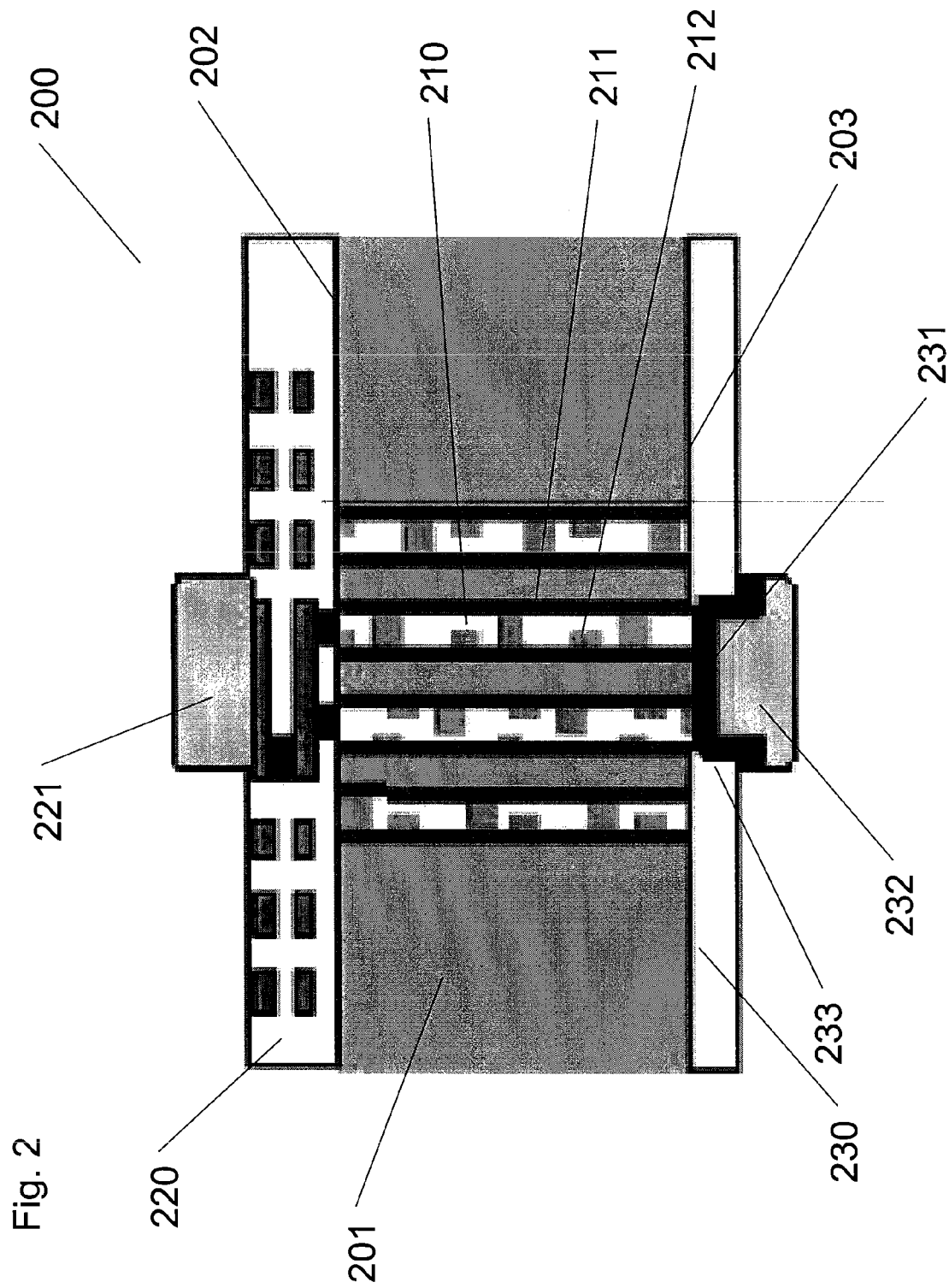
FIG. 2 shows a schematic representation of an integrated circuit according to an embodiment of the present invention.

FIG. 2 shows a schematic illustration of an integrated circuit 200 according to an embodiment of the present invention. The integrated circuit 200 may be used in a chip stack 101 of a chip package 100 as shown in FIG. 1. The integrated circuit 200 may for example be a DRAM chip. The integrated circuit 200 may as well be another kind of memory chip. The integrated circuit 200 may as well be another kind of semiconductor device that contains through silicon vias, like an interposer chip or even a solar cell.

The integrated circuit 200 may comprise a substrate 201. The substrate 201 may for example be a silicon wafer. The substrate 201 may as well be another kind of semiconductor material. The substrate 201 may comprise an upper surface 202 and a lower surface 203.

The integrated circuit 200 may further comprise at least one via or a plurality of vias 210 arranged in the substrate 201. The vias 210 may extend from the upper surface 202 of the substrate 201 to the lower surface 203 of the substrate 201. The vias 210 may comprise the shape of a cylinder. The longitudinal direction of a cylindrical via 210 may be arranged between the upper surface 202 of the substrate 201 and the lower surface 203 of the substrate 201. The vias 210 may as well comprise a block-shape with a longitudinal direction extending from the upper surface 202 of the substrate 201 to the lower surface 203 of the substrate 201.

A via 210 arranged in the substrate 201 may be filled with a conductive filling material 212 that comprises carbon. The filling material 212 may be electrically conductive. The filling material 212 may comprise a low resistivity. The filling material 212 inside a via 210 may for example comprise a resistivity below 1 mΩ cm. The filling material 212 inside a via 210 may as well comprise a resistivity below 50 μΩ cm. The filling material 212 may comprise boron or nitrogen. The filling material 212 may for example comprise 75% to 80% of carbon, 15% to 20% of boron and 2% to 8% of nitrogen. The filling material 212 may as well comprise another compound that contains carbon.

In an embodiment using a carbon fill, the filling material may exhibit conductivity comparable to metals like tungsten or copper and withstand thermal treatment at temperatures of 1240° C. In this case, deterioration of the carbon fill or out diffusion of filling components into the surrounding dielectric and/or the silicon material may be reduced or prevented. The resistivity of the via with the carbon fill may be lower than in the case of a polycrystalline silicon fill, especially since polycrystalline silicon tends to form voids, which further increases the via resistance, leading to higher RC-delay and/or higher power dissipation.

In an embodiment, the via 210 with the conductive carbon fill is formed before the formation of the integrated circuit, so called via-first technology. The via-first technology may contribute to process simplification and/or reduced production costs.

The filling material 212 of a via 210 arranged in the substrate 201 may be isolated from the substrate 201 by an isolation layer 211 arranged on the side walls of the via 210. The isolation material 211 may for example comprise silicon oxide. The isolation material 211 may as well comprise silicon nitride. The isolation material 211 may as well comprise another oxide or nitride or another material that provides electric isolation.

The length of a via 210 extending between the upper surface 202 of the substrate 201 and the lower surface 203 of the substrate 201 may be between 1 μm and 500 μm. The length of a via 210 may as well be lower or higher. A via 210 may comprise a diameter between 0.1 μm and 50 μm. The aspect ratio of the length of a via 210 to the diameter of the via 210 may be between 1 and 500.

The upper surface 202 of the substrate 201 of the integrated circuit 200 illustrated in FIG. 2 may comprise transistors, resistors, capacitors and other electronic components (not illustrated in FIG. 2).

A metallization layer 220 may be arranged on the upper surface 202 of the substrate 201 of the integrated circuit 200 illustrated in FIG. 2. FIG. 2 shows a schematic representation of the metallization layer 220. The metallization layer 220 may interconnect the integrated circuits arranged on the upper surface 202 of the substrate 201. The metallization layer 220 may also provide electrical connections to the vias 210 arranged in the substrate 201.

One or more upper contact pads 221 may be arranged on top of the metallization layer 220. The upper contact pads 221 may provide a conductive connection to the vias 210 through the metallization layer 220. Each upper contact pad 221 may provide a conductive connection to one or more vias 210. In the schematic illustration of FIG. 2, an upper contact pad 221 provides an electrical connection to two vias 210. The upper contact pad 221 may for example comprise gold.

On the lower surface 203 of the substrate 201 of the integrated circuit 200, an isolation layer 230 may be arranged. The isolation layer 230 may for example comprise silicon oxide. The isolation layer 230 may as well comprise silicon nitride. The isolation layer 230 may as well comprise another oxide or nitride or another material that provides electric isolation.

The isolation layer 230 arranged on the lower surface 203 of the substrate 201 may comprise one or more holes 233. The holes 233 may be arranged in the isolation layer 230 at those positions of the lower surface 203 of the substrate 201 where vias 210 are located. Each hole 233 may be provided at the location of one or more vias 210. In the schematic illustration of FIG. 2, a hole 233 is provided at a location of two vias 210 extending between the lower surface 203 of the substrate 201 and the upper surface 202 of the substrate 201.

Inside the hole 233 arranged in the isolation layer 230, a metallization layer 231 may be provided. The metallization layer 231 may be electrically connected to one or more vias 210 arranged in the substrate 201. In the schematic illustration of FIG. 2, a metallization layer 231 is electrically connected to two vias 210.

On the metallization layer 231 a solder bump 232 may be arranged. The solder bump 232 may be electrically connected to the metallization layer 231. The solder bump 232 may for example comprise gold, copper, nickel, aluminum or an alloy of gold, copper, nickel, or aluminum. Each solder bump 232 may provide an electrical connection to one or more vias 210 arranged in the substrate 201 of the integrated circuit 200. In the schematic illustration of FIG. 2, a solder bump 232 provides an electrical connection to two vias 210.

In the integrated circuit 200 illustrated in FIG. 2, the upper contact pad 221 is electrically connected to the solder bump 232 through the metallization layer 220, one or more vias 210 extending from the upper surface 202 of the substrate 201 to the lower surface 203 of the substrate 201, and the metallization layer 231.

A method of producing an integrated circuit 200 as schematically illustrated in FIG. 2 is explained in the following. Consecutive fabrication steps of the integrated circuit 200 are schematically depicted in FIGS. 3 to 10.

Figure 3:
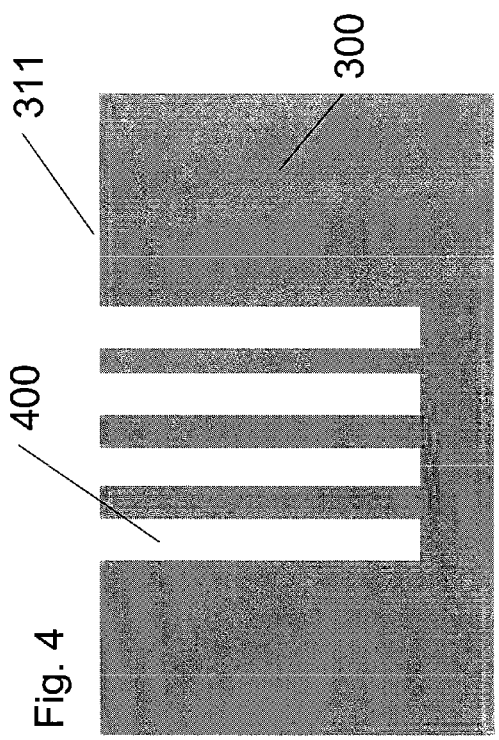
FIG. 3 shows a schematic representation of a substrate with a hard mask according to an embodiment of the present invention.

FIG. 3 shows a schematic illustration of a silicon substrate 100 according to an embodiment. The silicon substrate 300 may for example be a silicon wafer. The substrate 300 may as well be another semiconductor material. The substrate 300 comprises a lower surface 310 and an upper surface 311.

A hard mask 301 may be deposited on the upper surface 311 of the substrate 300. The hard mask 301 may for example be a silicon oxide hard mask. The hard mask 301 may as well comprise another material that is suitable to serve as a mask in a following process of selective substrate material removal.

The hard mask 301 may partially cover the upper surface 311 of the substrate 300. The hard mask 301 may comprise holes located at positions of the upper surface 311 of the substrate 300 at which the creation of vias is desired. At the locations of the holes in the hard mask 301, the upper surface 311 of the substrate 300 may not be covered by the hard mask 301. All other parts of the upper surface 311 of the substrate 300 may be covered by the hard mask 301.

The holes of the hard mask 301 may allow to selectively remove parts of the upper surface 311 of the substrate 300. Parts of the upper surface 311 may be removed by an etch process. The parts of the upper surface 311 of the substrate 300, that are covered by the hard mask 301 are not removed. The parts of the upper surface 311 of the substrate 300 where the hard mask 301 comprises holes, are selectively removed.

The substrate 300 may be removed anisotropically through the holes in the hard mask 301. This forms holes that extend perpendicular from the upper surface 311 of the substrate 300 into the substrate 300. The cross section of these holes may be determined by the shape of the holes in the hard mask 301.

After the removal of parts of the upper surface 311 of the substrate 300 the hard mask 301 can be removed from the upper surface 311 of the substrate 300.

Figure 4:
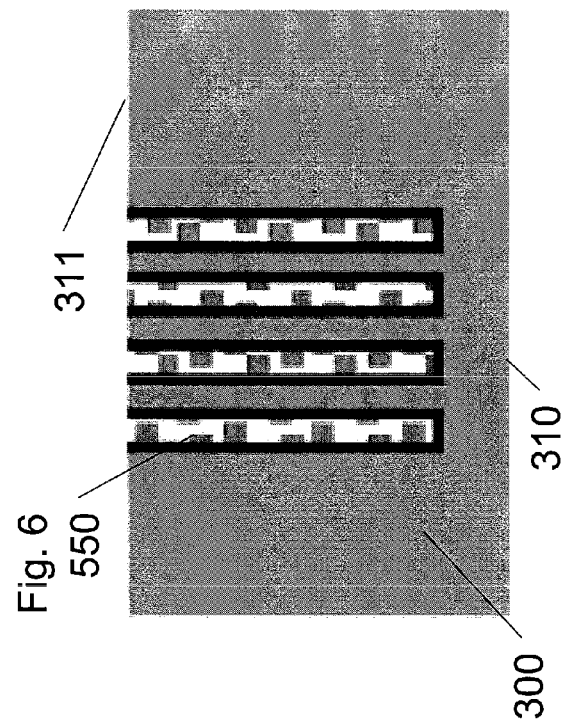
FIG. 4 shows a schematic representation of a substrate with holes according to an embodiment of the present invention.

FIG. 4 schematically shows the substrate 300 after the partial removal of substrate material according to an embodiment. A plurality of holes 400 extend perpendicular from the upper surface 311 of the substrate 300 into the substrate 300. The holes 400 are formed at those positions of the upper surface 311 of the substrate 300 where the hard mask 301 shown in FIG. 3 comprises holes. In the production stage shown in FIG. 4, the hard mask 301 has been removed. In another embodiment, however, the hard mask 301 may remain on the substrate.

Each hole 400 in FIG. 4 may comprise a diameter between 0.1 μm and 50 μm. Each hole 400 may also comprise a higher or lower diameter. Each hole 400 may extend between 1 μm and 500 μm into the substrate 300. Each hole 400 may also have a larger or smaller extension into the substrate 300. The aspect ratio of the extension of each hole 400 into the substrate 300 to the diameter of the hole 400 may be between 1 and 500. Each hole may also comprise a larger or smaller aspect ratio. The holes 400 may be located at any position of the upper surface 311 of the substrate 300. Any number of holes 400 may be provided in the substrate 300.

Figure 5:
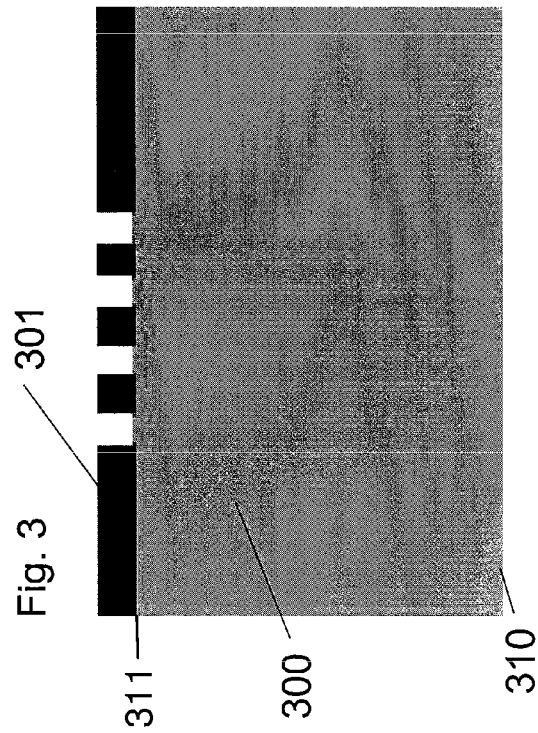
FIG. 5 shows a schematic representation of a substrate with filled holes and an excess layer according to an embodiment of the present invention.

FIG. 5 schematically shows the substrate 300 after a following production step 100 according to an embodiment. In this production step, the side walls of the holes 400 may be isolated by depositing an isolation layer 500 on the side walls of the holes 400. After the isolation of the side walls of the holes 400, the holes 400 may be filled with a conductive filling material 502.

FIG. 5 schematically shows the substrate 300 with holes 400 extending perpendicular from the upper surface 311 of the substrate 300 into the substrate 300. The side walls of the holes 400, the bottom of the holes 400 inside the substrate 300, and the upper surface 311 of the substrate 300 may be covered by the isolation layer 500. The isolation layer 500 may comprise silicon oxide. The isolation layer 500 may also comprise silicon nitride. The isolation layer 500 may also comprise another material that is suitable to isolate the holes 400 from the silicon substrate 300.

In the schematic representation of FIG. 5, the holes 400 are filled with the filling material 502. The filling material 502 also covers the isolation layer 500 on the upper surface 311 of the substrate 300 to form an excess layer 501.

The conductive filling material 502 comprises carbon. In addition to carbon, the filling material 502 may also comprise boron or nitrogen. The filling material 502 may comprise 75% to 80% of carbon, 15% to 20% of boron and 2% to 8% of nitrogen. In this case the filling material 502 may comprise a resistivity below 50 µΩ cm. The filling material 502 may as well comprise another compound that contains carbon.

The deposition of filling material 502 may be carried out using chemical vapor deposition. The chemical vapor deposition may be carried out in a gas environment containing carbon. The gas may be a mixture of argon and acetylene. The gas may also comprise methane or ethylene. The gas may also be another gas that contains carbon. The gas may also comprise hydrogen.

The deposition of the filling material 502 may be carried out by applying short pulses of the gas that contains carbon. The pulses may last for ten seconds. The pulses may be separated by pauses. The pauses may last for 20 seconds. The pulses and pauses may also last for other amounts of time, so as long as the pulses and pauses are sufficiently long enough to accomplish the deposition of the filling material as known to a person skilled in the art. The deposition of the filling material 502 may also be carried in another way known to a person skilled in the art.

The carbon containing gas may also comprise doping materials. The gas may for example comprise tryphenyl boron. In this case, the deposition of the filling material 502 may be carried out at a pressure between 1 mbar and 150 mbar. The deposition of the filling material 502 may be carried out at a temperature between 600° C. and 1000° C. The deposition of the filling material 502 may as well be carried out at other pressures and temperatures. The deposition process may comprise a pyrolytic decomposition of the gas, leading to pyrolytic carbon as filling material 502 in this case.

The doping materials may also comprise a gaseous mixture of boron trichloride, ammonia and acetylene, diluted in hydrogen. In this case, the deposition of the filling material 502 may be carried out at a pressure between 5 mbar and 100 mbar. The deposition of the filling material 502 may be carried out at a temperature between 800° C. and 1200° C. The deposition of the filling material 502 may as well be carried out at other pressures and temperatures.

An extremely low specific resistivity of the filling material 502 in the order of 50 µΩ cm may be achieved by using a gaseous mixture of boron trichloride, ammonia and acetylene, diluted in hydrogen as doping materials at a temperature in the range of 900° C. to 1150° C. under a pressure of 10 mbar to 60 mbar. The hydrogen flow rate may be adjusted to 200 sccm and the total flow rate of the source gases may be adjusted to 80 sccm. The ratio of the flow rate of boron trichloride to the total flow rate of the source gases may be adjusted to 0.7.

In an embodiment, the above described deposition methods may lead to substantially void-free conductive carbon fillings, which are stable during the subsequent temperature steps.

In a following processing step, the excess layer 501 and the isolation layer 500 covering the upper surface 311 of the substrate 300 may be removed. The excess layer 501 may be removed using a recess etch, for example a down stream oxygen plasma. Other known recess etches may as well be used. The excess layer 501 may as well be removed using chemical-mechanical polishing. The excess layer 501 may as well be removed using another technique.

Figure 6:
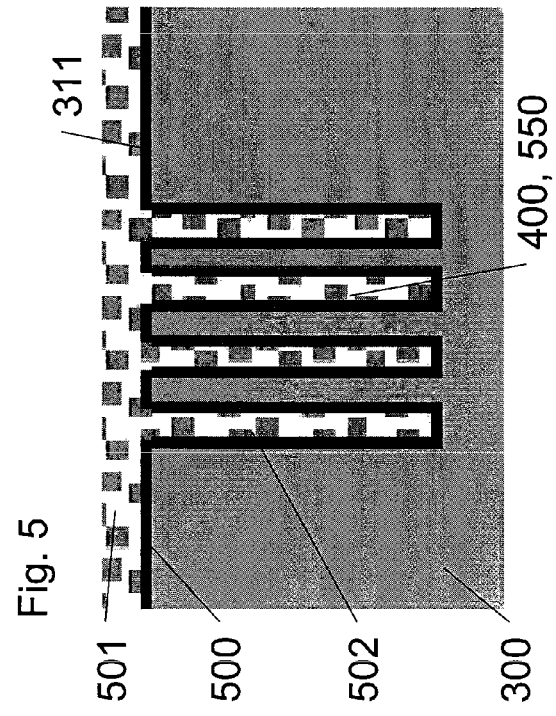
FIG. 6 shows a schematic representation of a substrate with filled holes according to an embodiment of the present invention.

FIG. 6 shows a schematic representation of the substrate 300 after the removal of the excess layer 501 and the isolation layer 500 from the upper surface 311 of the substrate 311 according to an embodiment.

At this point, the substrate 300 with filled holes 550 illustrated in FIG. 6 may be processed further. The substrate 300 may be processed with a conventional DRAM process flow, forming integrated circuits on the upper surface 311 of the substrate 300. The substrate 300 may as well be processed with another processing technique that forms integrated circuits on the upper surface 311 of the substrate 300. The integrated circuits arranged on the upper surface 311 of the substrate 300 may comprise transistors, resistors, capacitors and other electronic components.

FIG. 7 schematically illustrates the substrate 300 after the formation of integrated circuits on the upper surface 311 of the substrate 300 according to an embodiment. The integrated circuits are not depicted in FIG. 7.

A metallization layer 700 may be arranged on the upper surface 311 of the substrate 300. FIG. 7 shows a schematic representation of the metallization layer 700. The metallization layer 700 may interconnect the integrated circuits arranged on the upper surface 311 of the substrate 300. The metallization layer 700 may also provide electrical connections to the holes 550 extending from the upper surface 311 of the substrate 300 into the substrate 300.

An upper contact pad 701 may be arranged on the metallization layer 700 on the upper surface 311 of the substrate 300 in FIG. 7. The upper contact pad 701 may provide an electric contact to one or more of the filled holes 550 through the metallization layer 700. In the schematic illustration of FIG. 7, the upper contact pad 701 may provide an electrical connection to two holes 550. The upper contact pad 701 may for example comprise gold.

In a following processing step, as illustrated in FIG. 8, a support 801 may be attached to the metallization layer 700 arranged on the upper surface 311 of the substrate 300 according to an embodiment. The support 801 may be a glass support. The support 801 may also be a ring, which is glued onto the outer diameter of the wafer or may consist of a silicon support ring formed by the chemical mechanical polishing process of wafer thinning. The support 801 may be attached to the metallization layer 700 with a glue 802. The glue 802 may for example be a resin.

In a following processing step, the substrate 300 may be thinned by partially removing the lower surface 310 of the substrate 300. The substrate 300 may be thinned by chemi-mechanical polishing. The substrate 300 may also be thinned by application of another back-grinding process and subsequent polishing. The support 801 may support the substrate 300 during the thinning and may avoid a damaging of the substrate 300.

After the partial removal of the lower surface 310 of the substrate 300 the substrate may become a thinned substrate 800. FIG. 8 shows a schematic view of the thinned substrate 800 after the thinning process. On the side of the substrate 800 that is opposed on the metallization layer 700, substrate material may be removed up to the filled holes 550. The filled holes 550 may extend from the upper surface 311 of the thinned substrate 800 to the new lower surface 810 of the thinned substrate 800, thereby forming vias 850 that extend from the metallization layer 700 on the upper surface 311 of the thinned substrate 800 to a lower surface 810 of the thinned substrate 800.

FIG. 9 shows the thinned substrate 800 after a further processing step according to an embodiment. An isolation layer 900 may be deposited on the lower surface 810 of the thinned substrate 800. The isolation layer 900 may partially cover the lower surface 810 of the substrate 800. The isolation layer 900 may comprise access holes 902 at the location of one or more vias 850. Each access hole 902 in the isolation layer 900 may be arranged at the location of one via 850. An access hole 902 in the isolation layer 900 may as well cover more than one via 850. In the schematic illustration of FIG. 9, an access hole 902 in the isolation layer 900 is provided at a location of two vias 850 extending between the lower surface 810 of the thinned substrate 800 and the upper surface 311 of the thinned substrate 800.

A metallization layer 901 may be deposited on the isolation layer 900 on the lower surface 810 of the thinned substrate 800. The metallization layer 901 may cover the isolation layer 900. At the locations of access holes 902, the metallization layer 901 may be in contact with the lower surface 810 of the substrate 800 and in conductive contact with one or more vias 850. In the schematic illustration of FIG. 9, a metallization layer 901 is electrically connected to two vias 850 at the location of an access hole 902.

FIG. 10 schematically illustrates the thinned substrate 800 after a further processing step according to an embodiment. A solder bump 1000 may be deposited on the metallization layer 901 at the location of the access hole 902 on the lower surface 810 of the thinned substrate 800. The solder bump 1000 may comprise gold, copper, nickel, or an alloy comprising one of these metals.

In FIG. 10, the metallization layer 901 may be removed from the isolation layer 900 everywhere except for the location of the access 902.

The solder bump 1000 may be electrically connected to the metallization layer 901. The metallization layer 901 may be electrically connected to one or more vias 850. The one or more vias 850 may be electrically connected to the upper contact pad 701 through the metallization layer 700.

In a following processing step, the support 801 and the glue 802 may be removed from the metallization layer 700 and the upper contact pad 701 on the upper surface 311 of the thinned substrate 800, to obtain the integrated circuit 200 as described above in the illustration of FIG. 2. The integrated circuit 200 may then be used in a chip stack 101 of a chip package 100 as shown in FIG. 1.

FIG. 11 illustrates a fabrication step for the creation of a via through a semiconductor substrate according to another embodiment of the present invention according to an embodiment. FIG. 11 schematically shows a substrate 1300 with an upper surface 1301. The substrate 1300 may be partially removed to form a hole 1302. The hole 1302 may extend perpendicular from the upper surface 1301 of the substrate 1300 into the substrate 1300. The hole 1302 may not extend to the lower surface of the substrate 1300.

Inside the hole 1302, the substrate 1300 may not completely removed. A plurality of pillars 1303 may remain inside the hole 1302. Each pillar 1303 may extend from the upper surface 1301 of the substrate 1300 to the bottom of the hole 1302. Each pillar 1303 may comprise an edge length of 2.5 µm in the plane of the upper surface 1301 of the substrate 1300. The distance between two neighboring pillars 1303 may be 2 µm. The pillars 1303 may also comprise another edge length and distance.

Furthermore, a frame 1304 of substrate material may remain inside the hole 1302. The frame 1304 may enclose the plurality of pillars 1303 inside the hole 1302. The walls of the frame 1304 may comprise a width of 2 µm in the direction of the plane of the upper surface 1301 of the substrate 1300. The distance between the frame 1304 and the pillars 1303 may be 2 µm. The width of the wall of the frame 1304, and the distance between the frame 1304 and the pillars 1303 may as well be larger or smaller.

The pillars 1303 and the frame 1304 may be effective as a fill assist pattern in the filling step of the holes, thus reducing the deposition time and/or thickness.

In a following production step, an isolation layer may be deposited on the side walls of the hole 1302. The hole 1302 may then be filled with a conductive filling material. This results in a filled hole as illustrated in FIG. 5 above. The filling material in the filled hole may enclose the pillars 1303 and the frame 1304.

The substrate 1300 may then be thinned by partially removing the lower surface of the substrate 1300. The substrate 1300 may be thinned up to the lower end of the filled hole. The filled hole will then form a conductive filled through via that extends from the upper surface 1301 of the substrate 1300 to the lower surface of the substrate 1300. The filled through via will have the pillars 1303 and the frame 1304 embedded.

The filling of the hole 1302 with a conductive filling material may consume less time than the filling of a hole that does not contain pillars 1303 and a frame 1304.

While the foregoing is directed to embodiments of the present invention, other and further embodiments of the present invention may be devised without departing from the basic scope thereof, and the scope thereof is determined by the claims that follow.

What is claimed is:

1. An integrated circuit, comprising:
    a substrate with a lower and an upper surface, the substrate comprising at least one via extending between the upper and the lower surface, wherein the via comprises a hole formed by substrate material removal with a diameter between 0.1 µm and 50 µm and a length between 1 µm and 500 µm, wherein the hole of the via comprises a conductive material that comprises 75% to 80% carbon, 15% to 20% of boron and 2% to 8% of nitrogen, wherein the conductive material entirely fills the hole of the via such that the conductive material is substantially free of voids,
    wherein a first metallic contact pad disposed above the upper surface of the substrate is coupled to a first end of the via and a second metallic contact pad disposed below the lower surface of the substrate is coupled to a second end of the via.

2. The integrated circuit as claimed in claim 1, wherein the substrate is a silicon substrate.

3. The integrated circuit as claimed in claim 1, wherein the conductive material is made of pyrolytic carbon.

4. An integrated circuit comprising:
a substrate with a lower surface and an upper surface, the substrate comprising at least one via extending between the upper and the lower surfaces, wherein the via comprises a frame of a substrate material and at least two pillars of the substrate material, the frame enclosing the at least two pillars, wherein the at least two pillars are surrounded, along a plane parallel to the lower and upper surfaces, by a conductive material of the via that comprises 75% to 80% carbon, 15% to 20% of boron and 2% to 8% of nitrogen, wherein the conductive material entirely fills the via such that the conductive material is substantially free of voids, and wherein the via has a diameter less than or equal to 50 μm.

5. The integrated circuit as claimed in claim 1, wherein the filling material features a resistivity below 1 mΩ cm.

6. The integrated circuit as claimed in claim 1, wherein the filling material features a resistivity below 50 μΩ cm.

7. The integrated circuit as claimed in claim 1, wherein an isolation layer is provided between a side wall of the via and the filling material.

8. The integrated circuit as claimed in claim 7, wherein the isolation layer comprises one of the group of silicon oxide and silicon nitride.

9. The integrated circuit as claimed in claim 1, wherein a metallization layer is arranged on the upper surface of the substrate, wherein the metallization layer electrically connects the integrated circuit and the via.

10. The integrated circuit as claimed in claim 1, wherein metallic contact pads are provided at both ends of the via.

11. The integrated circuit as claimed in claim 1, wherein the integrated circuit is a memory chip.

12. The integrated circuit as claimed in claim 1, wherein the integrated circuit is a DRAM chip.

13. The integrated circuit as claimed in claim 1, wherein the integrated circuit is arranged in a chip stack comprising a plurality of integrated circuits.

14. The integrated circuit as claimed in claim 13, wherein the via of the integrated circuit is connected to a via of another integrated circuit in the chip stack by a bump bond.

15. The integrated circuit as claimed in claim 13, wherein the chip stack is mounted on a feedthrough interposer chip, wherein the chip stack is sealed through molding on the feedthrough interposer chip.

16. A method for producing an integrated circuit with a via, the method comprising:
providing a semiconductor substrate with an upper and a lower surface;
partially removing substrate material to form at least one hole extending from an upper surface into the substrate and toward the lower surface, wherein the hole has a diameter less than or equal to 50 μm and a length less than or equal to 500 μm;
depositing a conductive filling material comprising 75% to 80% carbon, 15% to 20% of boron and 2% to 8% of nitrogen into a center of the hole; and
after depositing the conductive filling material, partially removing substrate material from the lower surface of the substrate thereby exposing the conductive filling material at the lower surface of the integrated circuit.

17. The method of claim 16, wherein the conductive filing material is deposited using chemical vapor deposition in a gas containing carbon, the gas is applied in a series of pulses separated by pauses.

18. The method as claimed in claim 17, wherein each pause lasts for approximately 20 seconds.

19. The method as claimed in claim 16, wherein the conductive filing material is deposited using chemical vapor deposition in a gas comprises one of the group of acetylene, ethylene, and methane.

20. The method as claimed in claim 16, wherein the conductive filing material is deposited using chemical vapor deposition in a gas comprises a doping material.

21. The method as claimed in claim 20, wherein the gas comprises triphenyl boron.

22. The method as claimed in claim 16, wherein the conductive filing material is deposited using chemical vapor deposition, the chemical vapor deposition is carried out at a pressure between 1 mbar and 150 mbar.

23. The method as claimed in claim 16, wherein the conductive filing material is deposited using chemical vapor deposition, the chemical vapor deposition is carried out at a temperature between 600° C. and 1000° C.

24. The method as claimed in claim 20, wherein the gas comprises a mixture of boron trichloride, ammonia, and acetylene.

25. The method as claimed in claim 24, wherein the chemical vapor deposition is carried out at a temperature between 800° C. and 1200° C.

26. The method as claimed in claim 16, further comprising, after the step of depositing the conductive filling material, removing excess layers of the conductive filling material from the upper surface of the substrate.

27. The method as claimed in claim 26, wherein excess layers of the conductive filling material are removed from the upper surface of the substrate using a downstream oxygen plasma.

28. The method as claimed in claim 16, further comprising, after partially removing substrate material to form at least one hole extending perpendicularly from the upper surface and toward the lower surface, lining the hole with a dielectric material.

29. The method as claimed in claim 16, wherein the conductive filling material is substantially free of voids.

30. The method as claimed in claim 17, wherein each pulse lasts for approximately 10 seconds.

31. The integrated circuit of claim 1, further comprising a metallization layer disposed on the upper surface of the substrate, the metallization layer interconnecting a plurality of circuit elements disposed on the upper surface of the substrate and providing an electrical connection between the via and the first metallic contact pad, wherein the first metallic contact pad is disposed on an upper surface of the integrated circuit.

32. The integrated circuit of claim 1, wherein the second metallic contact pad is disposed on a lower surface of the integrated circuit and is configured to receive a connective material for electrically coupling the integrated circuit and the via to a different integrated circuit or a different substrate.

* * * * *